(12) United States Patent
Wiesbauer et al.

(10) Patent No.: US 7,453,382 B2
(45) Date of Patent: Nov. 18, 2008

(54) METHOD AND APPARATUS FOR A/D CONVERSION

(75) Inventors: Andreas Wiesbauer, Pörtschach (AT); Luis Hernandez, Madrid (ES); David San Segundo Bello, Villach (AT); Antonio Di Giandomenico, Velden (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/651,925

(22) Filed: Jan. 10, 2007

(65) Prior Publication Data

US 2008/0165043 A1 Jul. 10, 2008

(51) Int. Cl.
*H03M 3/00* (2006.01)

(52) U.S. Cl. .................................. 341/143; 341/155

(58) Field of Classification Search .......... 341/120–170
See application file for complete search history.

(56) References Cited

U.S. PATENT DOCUMENTS

| | | | |
|---|---|---|---|
| 4,977,403 A * | 12/1990 | Larson | 341/143 |
| 4,990,914 A | 2/1991 | Giancarlo | |
| 6,940,436 B2 * | 9/2005 | Hezar et al. | 341/143 |
| 6,956,517 B1 * | 10/2005 | Baker et al. | 341/155 |
| 7,129,875 B1 | 10/2006 | Altun et al. | |

OTHER PUBLICATIONS

M. Motz et al. "An Integrated Magnetic Sensor with Two Continuous-Time ΔΣ-Converters and Stress Compensation Capability." *ISSCC 2006/Session 16/ MEMS and Sensors/ 16.6*. IEEE International Solid-State Circuits Conference. pp. 298-299, 655. (3 Pages).

\* cited by examiner

*Primary Examiner*—Lam T Mai
(74) *Attorney, Agent, or Firm*—Maginot, Moore & Beck

(57) ABSTRACT

A method and an apparatus for converting an analog input signal into a digital output signal using a sigma-delta modulator architecture with a digital tracking filter. The digital tracking filter may have and order greater than one, and the signal and noise transfer functions of the sigma-delta modulator architecture are chosen to provide a sigma-delta modulator architecture with a high dynamic range even if a relatively low oversampling ratio is used.

38 Claims, 4 Drawing Sheets

| $\alpha$ | 0.0539 |
|---|---|
| $a_1$ | $\alpha-1$ |
| $b_1$ | $-1$ |
| $a_2$ | $\alpha-1$ |
| $b_2$ | $-1$ |
| K | 3.7 |
| G(z) | $\dfrac{1}{1+(\alpha-2)z^{-1}+z^{-2}}$ |

Table I

| STF1 | $z^{-1} \cdot (z^{-2}+(\alpha-2)z^{-1}+1)$ |
|---|---|
| STF2 | $z^{-1}$ |
| NTF1 | $(z^{-2}+(\alpha-2)z^{-1}+1)^2$ |
| NTF2 | $z^{-2}+(\alpha-2)z^{-1}+1$ |

Table II

METHOD AND APPARATUS FOR A/D CONVERSION

FIELD

The present invention relates to a method and an apparatus for converting an analog input signal to a digital output signal. In particular, the present invention relates to such a method and such an apparatus using a so-called sigma-delta modulator for the conversion of the analog input signal to the digital output signal.

BACKGROUND

Analog/digital converters (A/D converters) are electrical circuit arrangements used for the conversion of a signal, such as a voltage or current, from the analog domain to the digital domain. A variety of different A/D converter types exist.

One known A/D converter design uses a so-called sigma-delta (or delta-sigma) modulator that samples an analog input signal at a relatively high sampling rate in order to perform a noise shaping function. This oversampling is commonly performed at a multiple of the so-called Nyquist sampling rate of the input signal frequency. Thereby, quantization noise power is spread over a bandwidth equal to the sampling frequency, thereby reducing the noise density in the band of interest. Sigma-delta A/D converters typically include a loop filter in the forward signal path to push some of the quantization noise into the higher frequency spectrum beyond the band of interest and a quantizer for quantizing the output signal of the loop filter.

In particular the development of sigma-delta A/D converters in low voltage technologies faces new design challenges that may require the development of new A/D architecture concepts. Sigma-delta A/D converters with a relatively low oversampling ratio (OSR) may at least partly solve problems like clock jitter, loop delay and stability problems by using multibit quantizers. However, new CMOS processes make the implementation of flash quantizers with a large number of quantization levels relatively difficult. Another problem is associated with the fact that a sigma-delta modulator produces a higher bit rate at its output compared with the bit rate produced by a so-called Nyquist converter having an equivalent resolution which may mostly be due to an inefficient low pass decimation filtering that is often performed on the digital output of the sigma-delta modulator.

SUMMARY

A method and apparatus for converting an analog input signal to a digital output signal is disclosed herein. The method comprises forming a difference signal between the analog input signal and an analog estimate signal of the analog input signal. The difference signal is filtered with a first filter function and quantized to obtain a quantized difference signal. The quantized difference signal is filtered with a second filter function having an order greater than 1 to obtain a digital estimate signal of the analog input signal. The digital estimate signal is converted to the analog estimate signal.

DETAILED DESCRIPTION OF THE INVENTION

To improve the resolution of a sigma-delta A/D converter a digital tracking filter can be used. This digital tracking filter is part of a digital prediction loop driven by the quantizer output of the sigma-delta modulator, whereby the digital prediction loop with the digital tracking filter is provided to generate an estimate signal of the analog input signal, whereby a difference signal between the analog input signal of the A/D converter and an analog version of the estimate signal is supplied to the sigma-delta modulator. In principle, the digital tracking filter digitally reconstructs the low frequency information of the sigma-delta A/D converter, to subtract it from the analog input signal. Consequently, the sigma-delta A/D converter core is fed only with the error of the estimate. By adapting the full scale of the sigma-delta A/D converter core to the maximum error signal, the resolution can be enhanced by the ratio of the maximum input signal amplitude to the maximum error signal amplitude, thereby enhancing the dynamic range of the entire A/D converter architecture, which makes this technique suitable in particular for high oversampling sigma-delta modulators.

Figure 1:
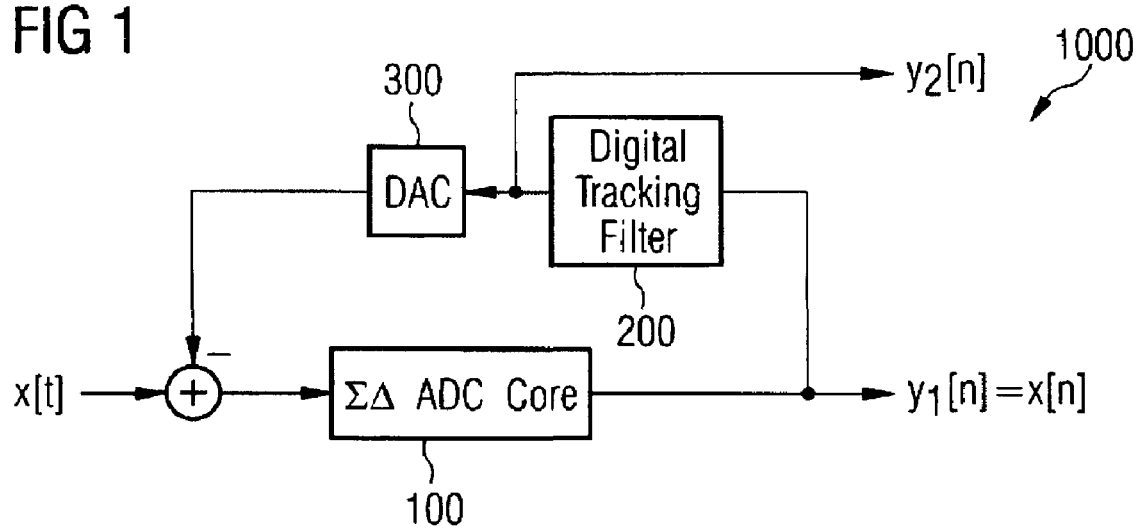
FIG. 1 shows a block schematic diagram of an exemplary analog/digital conversion apparatus according to an embodiment of the present invention.

FIG. 1 shows a block diagram of an A/D converter apparatus using a sigma-delta modulator according to an embodiment of the present invention. The A/D converter 1000 comprises a sigma-delta A/D converter core (ADC core) 100 which usually comprises a loop filter and a quantizer connected to the output of the loop filter, both components being not shown in FIG. 1. The output of the quantizer of the sigma-delta ADC core 100 is connected to a digital tracking filter 200 of the type as described above. This digital tracking filter 200 digitally filters the quantized signal $y_1[n]$ of the quantizer of the sigma-delta ADC core to obtain a digital estimate signal $y_2[n]$ of the analog input signal $x(t)$ of the A/D converter. This digital estimate signal is converted into a corresponding analog estimate signal by means of a D/A converter 300. The analog estimate signal is supplied to an adder for subtracting the analog estimate signal from the analog input signal $x(t)$. The difference signal between the analog input signal and the analog estimate signal is supplied to the sigma-delta ADC core 100. The output signal $y_1[n]$ of the sigma-delta ADC core 100 is a quantized discrete version of the analog input signal $x(t)$, while the output signal $y_2[n]$ of the digital tracking filter 200 is that signal which will be usually considered the output of the sigma-delta modulator.

As will be shown in the following in more detail, according to an embodiment of the invention, a high dynamic range with a high resolution of the sigma-delta modulator, which is also applicable to sigma-delta modulators having a low OSR, can be achieved by using a high order digital tracking filter 200, that is a digital tracking filter having an order>1, and in particular by using a second order or third order digital tracking filter, while higher order filters are possible as well.

Figure 2:
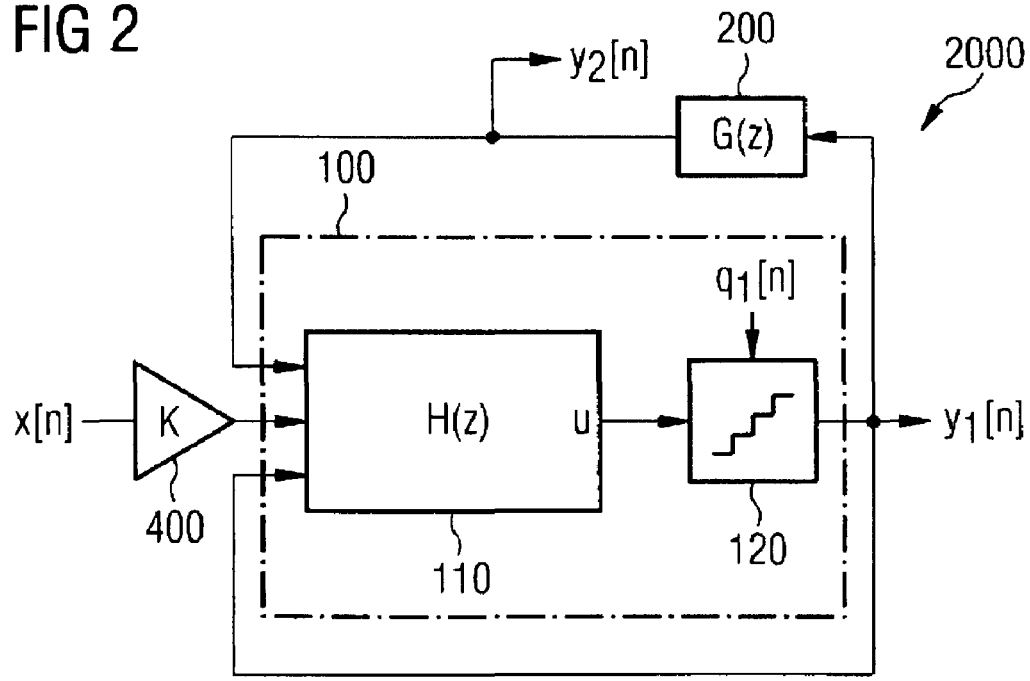
FIG. 2 shows a block schematic diagram of an exemplary analog/digital conversion apparatus according to another embodiment of the present invention.

FIG. 2 shows a block diagram of an A/D converter apparatus according to another embodiment of the present invention. Similar to FIG. 1, the A/D converter apparatus 2000 of FIG. 2 comprises a sigma-delta ADC core 100, whereby in FIG. 2 the loop filter 110 and the quantizer 120 of the sigma-delta ADC core 100 are depicted in detail.

In the following, to simplify matters, the A/D converter architecture of FIG. 2 will be discussed in the discrete time domain. However, it should be noted that as a matter of course embodiments of the invention can also be applied to continuous time implementations by replacing the discrete time loop filter 110 of FIG. 2 by an equivalent continuous time filter.

The loop filter 110 of the sigma-delta ACD core 100 has a transfer function H(z) in the Z domain, and in FIG. 2 it is assumed that the quantizer 120 introduces some quantization noise $q_1[n]$, whereby similar to FIG. 1 n corresponds to the discrete time variable. Furthermore, similar to FIG. 1, the output of the quantizer 120 is connected to a digital tracking filter 200 having a transfer function G(z). The digital tracking filter 200 produces a digital estimate $y_2[n]$ of the analog input signal $x[n]$ of the sigma-delta A/D converter apparatus.

In the embodiment of FIG. 2, it is assumed that both $y_1[n]$, which is the output signal of the quantizer 120, and $y_2[n]$, which is the output signal of the digital tracking filter 200, are fed back to a corresponding input of the loop filter 110 of the sigma-delta ADC core 100. In a practical implementation, $y_2[n]$ will be computed by a digital logic circuit, and the feedback connection between the digital tracking filter 200 and the loop filter 110 would call for a D/A converter similar to the D/A converter 300 shown in FIG. 1. However, since the embodiment of FIG. 2 is discussed in the discrete time domain, this separate D/A converter is not shown in FIG. 2. It should be noted that such a D/A converter usually has a resolution different from that of the quantizer 120 and may require some compensation of non-linearity, for example by applying a calibration or mismatch shaping technique.

The A/D converter architecture of FIG. 2 may be analyzed using a linear model in the Z domain. In particular, the outputs $Y_1(z)$ and $Y_2(z)$ may be computed using the following equations in the Z domain:

$$Y_1(z) = NTF_1(z) \cdot Q_1(z) + STF_1(z) \cdot X(z)$$

$$Y_2(z) = NTF_2(z) \cdot Q_1(z) + STF_2(z) \cdot X(z) \quad (1)$$

The above equations compute $Y_1(z)$ and $Y_2(z)$ depending on $Q_1(z)$ and $X(z)$ as well as a corresponding noise transfer function $NTF_1(z)$ and $NTF_2(z)$, respectively, and a corresponding signal transfer function $STF_1(z)$ and $STF_2(z)$, respectively. The transfer functions between the individual inputs and the output of the loop filter 110 can be expressed by rational polynominal functions in the Z domain:

$$H_x(z) = \frac{A(z)}{P(z)} = \frac{U(z)}{X(z)}\bigg|_{y1,y2=0} \quad (2)$$

$$G(z) = \frac{C(z)}{D(z)}$$

$$H_{y1}(z) = \frac{B_1(z)}{P(z)} = \frac{U(z)}{Y_1(z)}\bigg|_{x,y2=0}$$

$$H_{y2}(z) = \frac{B_2(z)}{P(z)} = \frac{U(z)}{Y_2(z)}\bigg|_{y1,x=0}$$

In the above equations, U(z) is the Z-transformed version of the output of the loop filter 110, while A(z), $B_1(z)$, $B_2(z)$, C(z), D(z) and P(z) correspond to the denominators and numerators, respectively, of the individual rational polynominal functions in the Z domain. As can be taken from the equations of (2), it is assumed that the rational polynominal functions $H_x(z)$, $H_{y1}(z)$ and $H_{y2}(z)$ have the same denominator function P(z).

It is now possible to insert the transfer functions of (2) in the equations of (1), and the following new equations can be obtained:

$$E(z) = B_1(z) \cdot D(z) + P(z) \cdot D(z) + B_2(z) \cdot C(z) \quad (3)$$

$$NTF_1(z) = \frac{P(z) \cdot D(z)}{E(z)} \quad STF_1(z) = \frac{A(z) \cdot D(z)}{E(z)}$$

$$NTF_2(z) = \frac{P(z) \cdot C(z)}{E(z)} \quad STF_2(z) = \frac{C(z) \cdot A(z)}{E(z)}$$

It should be noted that, in (3), E(z) is an auxiliary function in the Z domain used to describe the common denominator function of the individual noise transfer functions and signal transfer functions.

From the equations of (3) it can be easily seen that $NTF_1(z)$ and $NTF_2(z)$ share P(z) in the numerator and, consequently, have common zeros, which may define a similar spectral shaping of the quantization noise. Furthermore, it can be taken from (3) that $NTF_1(z)$ and $STF_1(z)$ share D(z) in the numerator and have common zeros as well.

This means that, according to an embodiment of the invention, D(z) and H(z) may be defined such that both $NTF_1(z)$ and $STF_1(z)$ have zeros in the band of interest as occupied by X(z). In addition, $NTF_2(z)$ and $STF_2(z)$ may be taylored to have the standard behavior of a sigma-delta modulator where quantization noise is attenuated in the band of interest, but the input signal is left to pass through. This means that $NTF_2(z)$ should have a high pass filter behavior that moves at least some of the quantization noise out of the band of interest of the input signal into a higher frequency spectrum, whereby $STF_2(z)$ should have a uniform gain, preferably close to unity, within the band of interest.

According to another embodiment of the invention, the individual transfer functions are chosen such that the common denominator of all signal and noise transfer functions in (3), namely E(z), guarantees the stability of the whole system, which can be achieved by introducing poles in the noise transfer functions. An appropriate choice for E(z) can be found by simulation of different options of E(z) and quantizer resolutions until the sigma-delta modulator becomes stable, which can be performed by using appropriate software tools that help to design the sigma-delta modulator in an iterative process. As can be taken from equations (2) and (3), these stability conditions and the choice of E(z) may impose some restrictions on the selection of H(z) and G(z).

A main advantage of the above-described A/D converter architecture is that, given the band reject nature of $STF_1(z)$, the quantizer 120 will mostly be responsive to quantization noise, and hence, the dynamic range of the quantizer 120 will not need to include the input signal, which allows a significant increase of the signal-to-noise ratio (SNR) of the overall sigma-delta modulator.

According to another embodiment of the present invention, it is proposed to provide a scaling factor K at the input of the sigma-delta modulator, as depicted in FIG. 2. FIG. 2 shows an amplifier 400 which amplifies the input signal $x[n]$ by a scaling factor K, whereby the amplified input signal is supplied to the loop filter 110 of the sigma-delta ADC core 100. The scaling factor K is chosen such that the maximum input amplitude is K times larger than the full scale value of $y_1[n]$.

An appropriate value of the scaling factor K can, for example, be computed approximately as follows. It may be assumed that the input range of the quantizer 120 is ±1. Furthermore, it is assumed that $\omega_0$ is the frequency at which $STF_1(z)$ has its maximum gain within the signal bandwidth of interest of the input signal. Given the high pass nature of $STF_1(z)$, this value would likely be reached at the end of the signal bandwidth, that is at $\omega_0=\pi/OSR$. Then, the maximum amplitude A of an input tone located at frequency $\omega_0$ would be the one that drives the quantizer 120 into saturation, that is:

$$A \cdot |STF_1(e^{j\omega 0})|=1 \quad (4)$$

If the input full scale of the sigma-delta modulator is redefined as ±1, the value of the scaling factor K would be:

$$K = \frac{1}{|STF_1(e^{j\omega_0})|} \quad (5)$$

The above-described embodiments allow to provide an improved sigma-delta A/D converter architecture with enhanced resolution, providing a dynamic range extension and allowing also low oversampling ratios. Furthermore, as a difference to so-called MASH (Multi-Stage Noise Shaping) converters which use a plurality of full converters in a pipeline-setup and, consequently, require a very high implementation effort and a good matching between the corresponding analog and digital circuitry, the invention does not require any filter matching. As described in connection with the above embodiments, in general only an additional D/A converter is used to provide the analog estimate signal to the input of the sigma-delta ACD core, while the rest of the additional circuitry is digital, and matching of analog and digital circuitry is consequently less critical.

Figure 8:
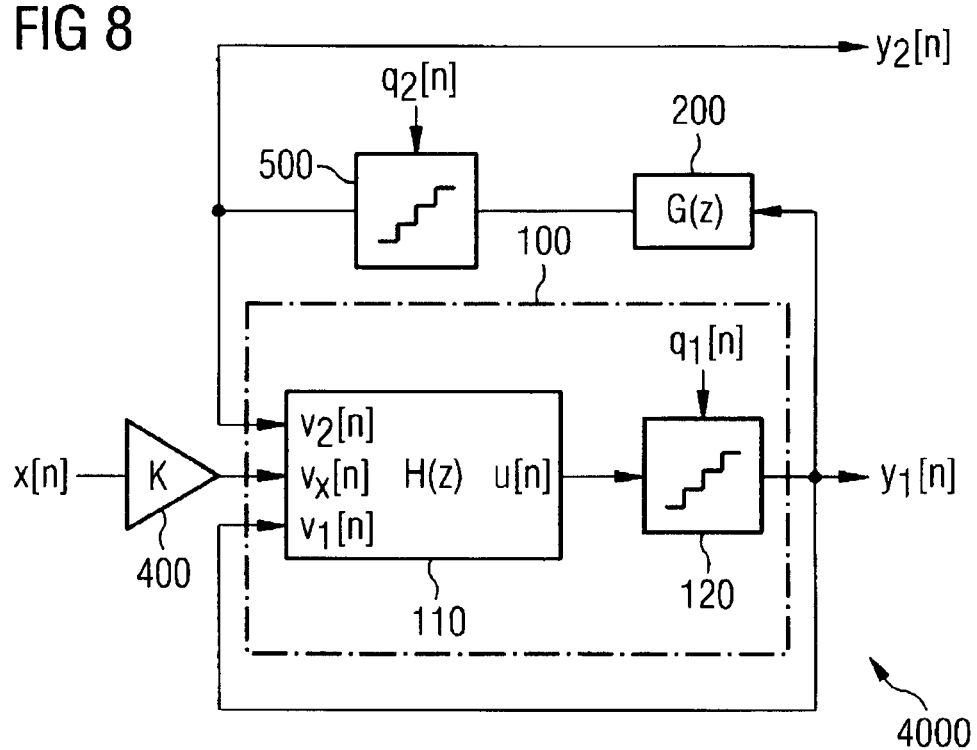
FIG. 8 shows a block schematic diagram of an exemplary analog/digital conversion apparatus according to another embodiment of the present invention.

For the sake of completeness, it should be noted that the output of the digital tracking filter, that is the output $y_2[n]$ of the sigma-delta modulator, may be optionally requantized. FIG. 8 shows a corresponding A/D converter apparatus 4000 similar to the embodiment of FIG. 2, however with an additional quantizer 500 between the digital tracking filter 200 and the loop filter 110 of the sigma-delta ADC core 100. As indicated in FIG. 8, this additional quantizer 500 introduces additional quantization noise $q_2[n]$.

To illustrate the operation of the above-proposed A/D converter architecture, in the following a further embodiment of the invention will be discussed in connection with FIG. 3.

Figures 3, 4:
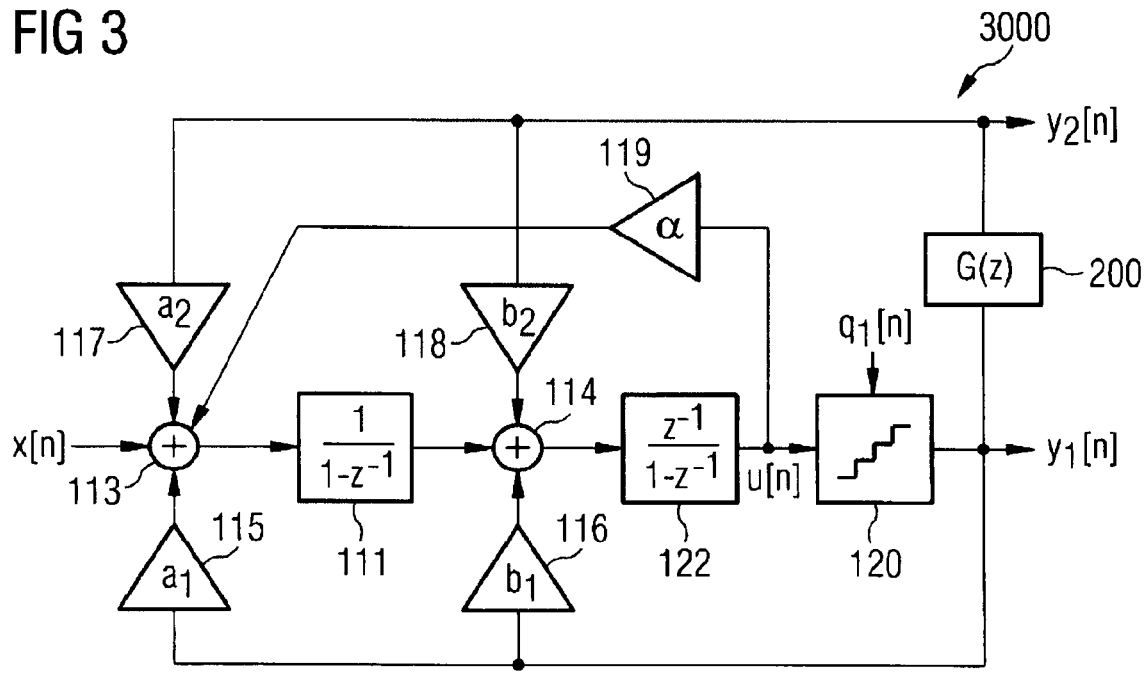
FIG. 3 shows a block schematic diagram of an analog/digital conversion apparatus according to a further embodiment of the present invention.
FIG. 4 shows tables with exemplary values for parameters of the embodiment depicted in FIG. 3.

FIG. 3 shows a block diagram of an A/D converter apparatus 3000 using, as the loop filter 110, a second order filter having the structure shown in FIG. 3. In particular, the loop filter 110 comprises a first filter stage 111 and a second filter stage 112 which have the transfer functions depicted in FIG. 3. Furthermore, the loop filter 110 comprises first and second adders 113 and 114 to which the output signal $y_1[n]$ of the quantizer 120 and the output signal $y_2[n]$ of the digital tracking filter 200 are fed via multipliers 115-118. Moreover, there is an additional multiplier 119 through which the output signal of the second filter stage 112 is fed back to the first adder 113.

Figure 5:
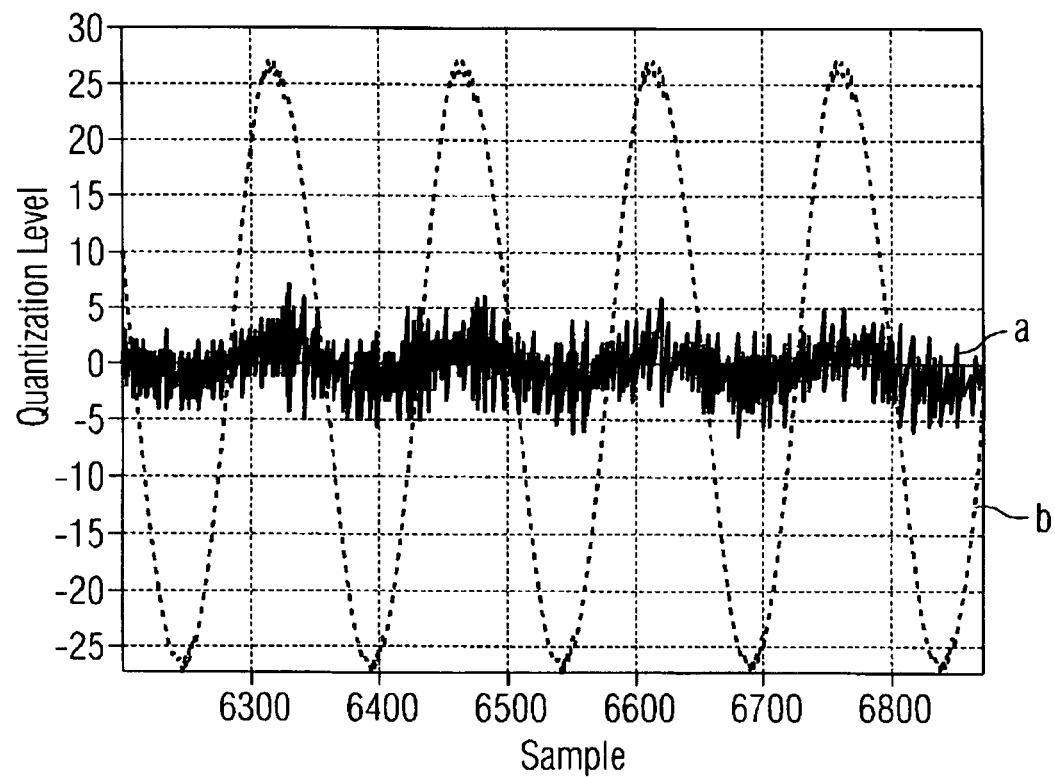
FIG. 5 shows time domain waveforms of simulation results for the embodiment shown in FIG. 3 and FIG. 4.

FIG. 5 shows possible values for the individual parameters of the sigma-delta A/D converter of FIG. 3, in particular for the coefficients $\alpha, a_1, a_2, b_1, b_2$ for the multipliers 115-119 and for the scaling factor K (see FIG. 2) to obtain a second order sigma-delta A/D converter with two complex conjugate zeros in its $NTF_2(z)$, whereby these particular values are optimized for an OSR=8 and a quantizer 120 using a 4 bit quantization. These values, however, are only exemplary, and of course a different oversampling ratio and a different resolution of the quantizer 120 may be used as well. In principle, the OSR can be of any value, whereby the disclosed embodiment of the invention is particularly suitable for low OSR sigma-delta modulators, that is sigma-delta modulators having an OSR of 20 or less. Such low OSR sigma-delta modulators are often used in wide bandwidth applications like VDSL, for example. Furthermore, the number of bits of the quantizer 120 is usually restricted by the feasibility of the quantizer and the stability of the sigma-delta modulator. More than 6 bits will seldom be used in practice because then the structure of the quantizer becomes relatively complex. On the other hand, the sigma-delta modulator shows a stable behavior from a certain number of bits of resolution of the quantizer, so that it may be preferred to use for example a quantizer resolution of up to 6 bits, in particular a quantizer resolution of 4-6 bits.

As already indicated above, according to an embodiment of the invention, the digital tracking filter 200 has an order >1, whereby the complexity of the digital tracking filter increases as the order of it rises. Usually, a first order filter like an integrator is not enough for low OSR sigma-delta modulators as it only enhances the dynamic range of signals close to DC level. The embodiment of the present invention proposes a digital tracking filter that has a high average gain in the whole bandwidth of the signal, whereby a second order filter as the digital tracking filter 200 could be a good choice because the digital hardware is still simple but allows to locate a pole in the edge of the signal pass band. Also a third order digital filter with a pole nearby DC and two complex conjugate poles could be an interesting option. High order filters are also theoretically possible.

The particular transfer function for G(z) shown in Table I of FIG. 4 has been computed to force the $STF_1(z)$ to have also two complex conjugate zeros at the same location as $NTF_2(z)$. As can be taken from Table II of FIG. 4, which shows all the signal and transfer functions for this particular embodiment, this results in a fourth order $NTF_1(z)$ where the zeros of $NTF_2(z)$ are doubled.

Figure 6:
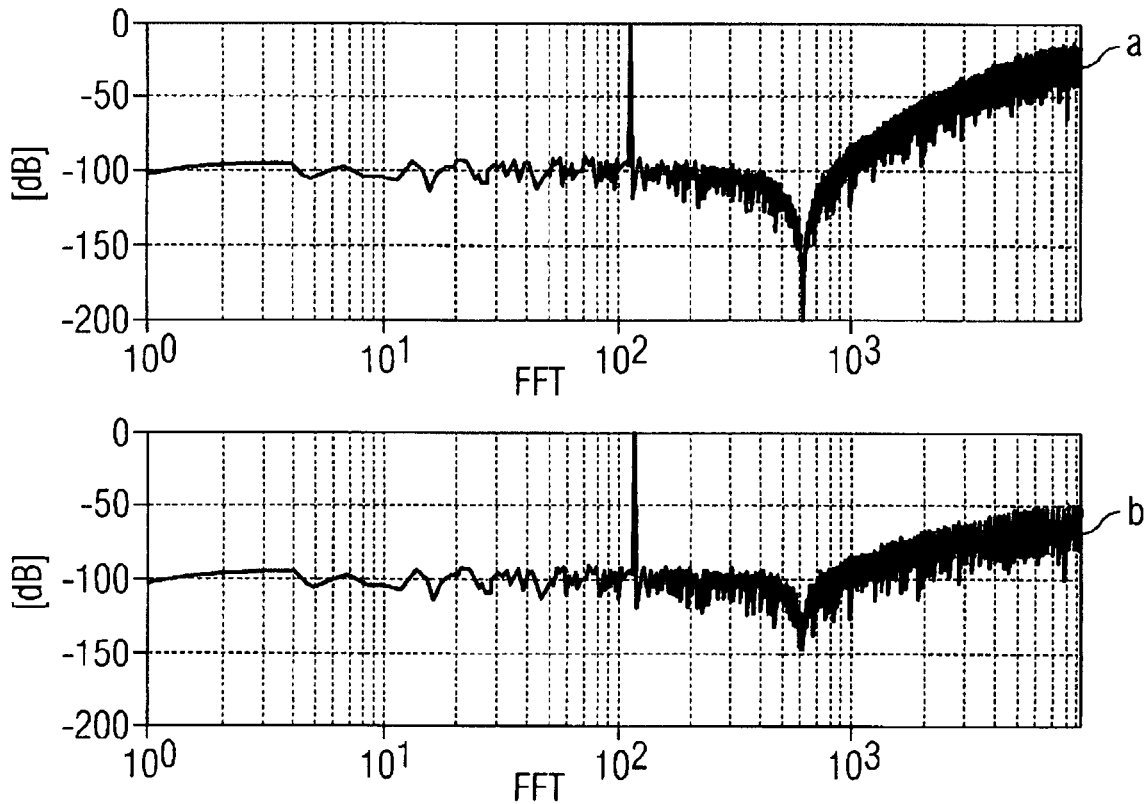
FIG. 6 shows FFT characteristics of simulation results of the embodiment shown in FIG. 3 and FIG. 4.

FIG. 5 and FIG. 6 show simulation results for the sigma-delta A/D converter apparatus of FIG. 3 and FIG. 4, whereby FIG. 5 shows the time domain waveforms for $y_1[n]$ (waveform a) and $y_2[n]$ (waveform b), while FIG. 6 shows the Fast Fourier Transformation (FFT) of $y_1[n]$ (FFT a) and $y_2[n]$ (FFT b).

As can be taken from FIG. 5, the waveform a for $y_1[n]$ shows 16 levels corresponding to the 4-bit quantization of the quantizer 120. Due to the scaling factor K, the amplitude of the output signal of the digital tracking filter 200 will be approximately K times larger than that of $y_1[n]$ so that the associated D/A converter would require $\log_2(K)$ more bits of resolution than the quantizer 120. According to Table I shown in FIG. 3, K=3.7 so that the output signal $y_2[n]$ of the digital tracking filter 200 consequently requires 6 bits for its representation so that the resolution of the feedback DAC converter 300 would also require 6 bits. In general, the output signal of the digital tracking filter 200 can be truncated to a lower resolution, whereby this truncation allows to simplify the implementation of the corresponding D/A converter 300, but is associated with additional quantization noise (see $q_2[n]$ shown in FIG. 8). On the other hand, this additional quantization noise $q_2[n]$ may also be spectrally shaped by the loop so that the effect of this truncation is actually only to diminish the maximum SNR achievable. Above equations (1)-(3) can be easily adapted to this embodiment, taking $Q_2(z)$ and the corresponding noise transfer functions for calculating $Y_1(z)$ and $Y_2(z)$ into account.

As can be taken from FIG. 6, the FFT b of the output signal $y_2[n]$ shows second order shaping and an SNR of 72 dB, whereby the simulation has been performed for a −3 dBfs tone. The FFT a for the output signal $y_1[n]$ shows a fourth order shaping and an SNR of 71 dB. Despite of its lower noise shaping order, the digital output signal $y_2[n]$ produces in general a signal independent SNR of a larger value than $y_1[n]$ and a lower out of band noise level, thereby facilitating the implementation of the decimation filter of the sigma-delta modulator. Hence, $y_2[n]$ is the preferred output signal of the sigma-delta modulator.

Figure 7:
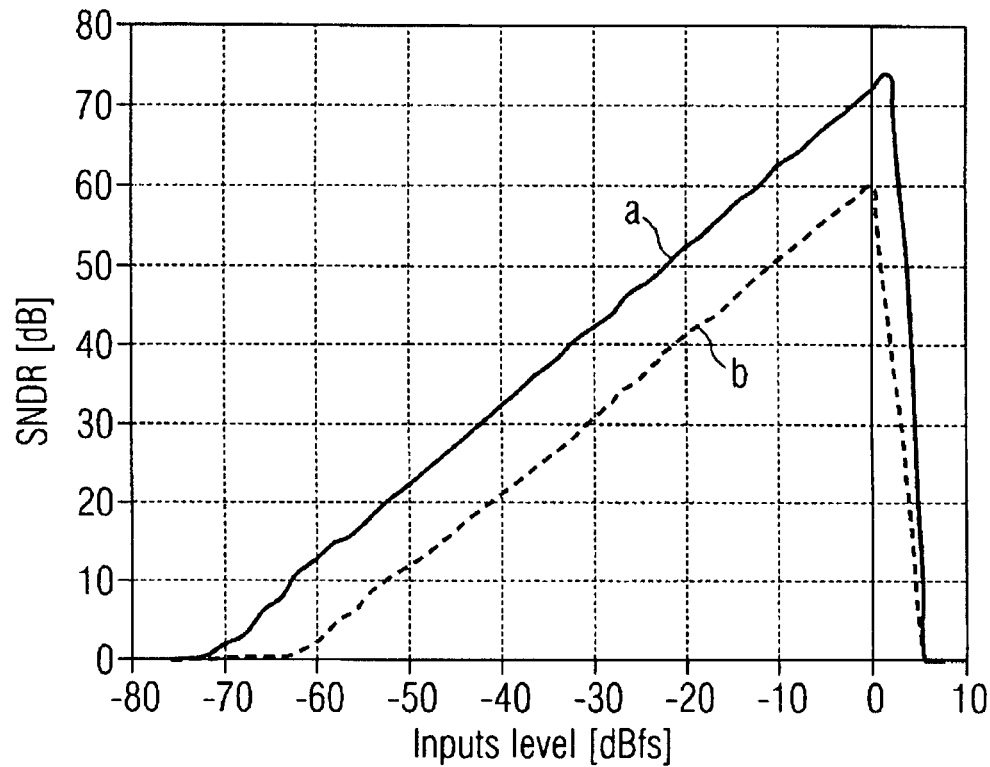
FIG. 7 shows a comparison of dynamic ranges of an analog/digital conversion apparatus of an embodiment of the present invention and a conventional analog/digital conversion apparatus.

FIG. 7 shows a comparison between the signal-to-noise plus distortion ratio characteristic (SNDR) of the sigma-delta A/D converter apparatus 3000 of FIGS. 3 and 4 and a conventional sigma-delta A/D converter obtained by eliminating $a_2$, $b_2$ and the digital tracking filter 200 in FIG. 3 and setting $a_1=b_1=1$. The characteristic a corresponds to the SNDR of the sigma-delta A/D converter apparatus 3000 of the embodiment of the invention, while the characteristic b corresponds to the conventional sigma-delta A/D converter. As can be seen, there is a maximum SNDR improvement of 11 dB which corresponds to the scaling factor K. Another option to enhance the SNDR would be the use of a multistage architecture like a MASH A/D converter, which however—as already mentioned above—requires a digital filter to combine the output signals of the individual stages. In contrast thereto, the sigma-delta A/D converter apparatus of the embodiment of the present invention does not require an accurate matching between the digital tracking filter 200 and the loop filter 110 as their pole locations do not need to be coincident.

Above, exemplary embodiments of the invention have been described in detail. However, it is to be understood that the above description has been given only for the purpose of illustrating the principles of embodiments of the invention, and the detailed description is not to be taken in a restricting sense. Rather, the scope of the invention is defined only by the appended claims and is not intended to be limited by the exemplary embodiments described above.

It is also to be noted that, in the above description of the exemplary embodiments, any direct connection or coupling between two functional blocks, devices, components, or other physical or functional units shown in the drawings or described herein could also be implemented by an indirect connection or coupling.

Finally, it is also to be understood that the features of the various exemplary embodiments described herein may be combined with each other, unless specifically noted otherwise, and that modifications within the knowledge of the skilled person are possible without departing from the scope of the invention. In particular, embodiments of the invention have been described above with reference to a discrete time sigma-delta modulator. However, embodiments of the invention are also applicable to continuous time sigma-delta modulators by replacing the discrete time loop filter 110 by an equivalent continuous time filter, imposing the impulse invariance principle in the transfer functions of formulas (2).

What is claimed is:

1. A method for converting an analog input signal to a digital output signal, the method comprising:
   forming a difference signal between the analog input signal and an analog estimate signal of the analog input signal;
   filtering with a first filter function and quantizing the difference signal to obtain a quantized difference signal;
   filtering the quantized difference signal with a second filter function having an order greater than one to obtain a digital estimate signal of the analog input signal, wherein the second filter function is a second order or third order filter function; and
   converting the digital estimate signal to the analog estimate signal.

2. The method according to claim 1, wherein the digital estimate signal is quantized by a further quantizer before converting it into the analog estimate signal.

3. The method according to claim 1, wherein the analog input signal is oversampled with an oversampling ratio less than or equal to twenty.

4. The method of claim 1, wherein the difference signal is quantized using a quantizer having a resolution of up to six bits to obtain the quantized different signal.

5. A method for converting an analog input signal to a digital output signal, the method comprising:
   scaling the analog input signal with a scaling factor K;
   forming a difference signal between the scaled analog input signal and an analog estimate signal of the analog input signal;
   filtering with a first filter function and quantizing the difference signal to obtain a quantized difference signal;
   filtering the quantized difference signal with a second filter function to obtain a digital estimate signal of the analog input signal; and
   converting the digital estimate signal to the analog estimate signal,
   wherein the scaling factor is $$K = \frac{1}{|STF_1(e^{j\omega_0})|},$$

wherein $STF_1$ is a signal transfer function defined between the quantized difference signal and the analog input signal and $\omega_0$ is a frequency at which $STF_1$ has a maximum gain within a given signal band of interest of the analog input signal.

6. The method according to claim 5, wherein the digital estimate signal is converted to the analog estimate signal using a digital-to-analog converter having a resolution of $\log_2(K)$ plus a resolution of a quantizer used for quantizing the different signal.

7. The method according to claim 5, wherein the second filter function is a second order filter function or a third order filter function.

8. The method according to claim 5, wherein the signal transfer function $STF_1$ has a high pass behavior.

9. The method according to claim 5, wherein a noise transfer function, which is defined between the quantized difference signal and a quantization noise introduced during the quantizing of the difference signal, and the signal transfer function $STF_1$ have common zeros.

10. A method for converting an analog input signal to a digital output signal, the method comprising:
    forming a difference signal between the analog input signal and an analog estimate signal of the analog input signal;
    filtering with a first filter function and quantizing the difference signal to obtain a quantized difference signal;
    filtering the quantized difference signal with a second filter function to obtain a digital estimate signal of the analog input signal; and
    converting the digital estimate signal to the analog estimate signal;

wherein a signal transfer function defined between the quantized difference signal and the analog input signal and a noise transfer function defined between the quantized difference signal and quantization noise introduced during the quantizing of the difference signal have common zeros.

11. The method according to claim 10, wherein the signal transfer function and the noise transfer function have common complex conjugate zeros.

12. The method according to claim 10, wherein the signal transfer function has a high pass behavior.

13. The method according to claim 10, wherein a further signal transfer function defined between the digital estimate signal and the analog input signal has an approximately uniform gain in a given signal band of interest of the analog input signal.

14. The method according to claim 10, wherein a further noise transfer function defined between the digital estimate signal and quantization noise introduced during the quantizing of the difference signal has a high pass behavior.

15. The method according to claim 10, wherein the first filter function has an order greater than one.

16. The method according to claim 10, wherein the analog input signal is oversampled with an oversampling ratio less than or equal to twenty.

17. The method according to claim 10, wherein the difference signal is quantized using a quantizer having a resolution of up to six bits.

18. The method according to claim 10, wherein the analog input signal is scaled using a scaling factor K before forming the difference signal with $$K = \frac{1}{|STF_1(e^{j\omega_0})|},$$

whereby $STF_1$ is the signal transfer function and $\omega_0$ is a frequency at which $STF_1$ has a maximum gain within a given signal band of interest of the analog input signal.

19. The method according to claim 18, wherein the digital estimate signal is converted to the analog estimate signal using a digital-to-analog converter having a resolution of $\log_2(K)$ plus a resolution of a quantizer used for quantizing the difference signal.

20. The method according to claim 10, wherein the digital estimate signal is quantized before converting it to the analog estimate signal.

21. An apparatus configured to convert an analog input signal to a digital output signal, the apparatus comprising:
a first filter configured to filter a difference signal between the analog input signal and an analog estimate signal of the analog input signal;
a quantizer configured to quantize the difference signal filtered by the first filter to obtain a quantized different signal;
a second filer having an order greater than one, the second filter configured to obtain a digital estimate signal of the analog input signal, and wherein the second filter is a second order or third order filter; and
a digital/analog converter configured to convert the digital estimate signal into the analog estimate signal.

22. The apparatus according to claim 21, wherein a further quantizer is provided between the second filter and an adder which is configured to form the difference signal.

23. The apparatus according to claim 21, wherein the quantizer has a resolution of up to six bits.

24. An apparatus configured to convert an analog input signal to a digital output signal, the apparatus comprising:
an amplifier configured to scale the analog input signal with a scaling factor K;
a first filter configured to filter a difference signal between the scaled analog input signal and an analog estimate signal of the analog input signal;
a quantizer configured to quantize the filtered difference signal to obtain a quantized difference signal;
a digital second filter configured to filter the quantized difference signal to obtain a digital estimate signal of the analog input signal; and
a digital/analog converter configured to convert the digital estimate signal to the analog estimate signal,
wherein the scaling factor is $$K = \frac{1}{|STF_1(e^{j\omega_0})|},$$

wherein $STF_1$ is a signal transfer function defined between the quantized difference signal and the analog input signal and $\omega_0$ is a frequency at which $STF_1$ has a maximum gain within a given signal band of interest of the analog input signal.

25. The apparatus according to claim 24, wherein the digital second filter has an order greater than one.

26. The apparatus according to claim 24, wherein the digital/analog converter has a resolution of $\log_2(K)$ plus a resolution of the quantizer.

27. The apparatus according to claim 24, wherein the signal transfer function $STF_1$ exhibits a high pass behavior.

28. The apparatus according to claim 24, wherein the signal transfer function $STF_1$ and a noise transfer function, which is defined between the quantized difference signal and quantization noise introduced by the quantizer, have common zeros.

29. An apparatus configured to convert an analog input signal to a digital output signal, the apparatus comprising:
a first filter configured to filter a difference signal between the analog input signal and an analog estimate signal of the analog input signal;
a quantizer configured to quantize the filtered difference signal to obtain a quantized difference signal;
a second filter configured to filter the quantized difference signal to obtain a digital estimate signal of the analog input signal; and
a digital/analog converter configured to convert the digital estimate signal to the analog estimate signal,
wherein a signal transfer function, which is defined between the quantized digital signal and the analog input signal, and a noise transfer function, which is defined between the quantized digital signal and quantization noise introduced by the quantizer, have common zeros.

30. The apparatus according to claim 29, wherein the signal transfer function and the noise transfer function have common complex conjugate zeros.

31. The apparatus according to claim 29, wherein the signal transfer function has a high pass behavior.

32. The apparatus according to claim 29, wherein a further signal transfer function, which is defined between the digital estimate signal and the analog input signal, has an approximately uniform gain in a given signal band of interest of the analog input signal.

33. The apparatus according to claim 29, wherein a further noise transfer function, which is defined between the digital estimate signal and the quantization noise introduced by the quantizer, has a high pass behavior.

34. The apparatus according to claim 29, wherein the second filter has an order greater than one.

35. The apparatus according to claim 29, wherein the quantizer is a quantizer having a resolution of up to six bits.

36. The apparatus according to claim 29, wherein an amplifier is configured to amplifying the analog input signal by a scaling factor K before forming the difference signal with $$K = \frac{1}{|STF_1(e^{j\omega_0})|},$$

wherein $STF_1$ is the signal transfer function defined between the quantized difference signal and the analog input signal and $\omega_0$ is a frequency at which the signal transfer function $STF_1$ has a maximum gain within a given signal band of interest of the analog input signal.

37. The apparatus according to claim 36, wherein the digital/analog converter has a resolution of $\log_2(K)$ plus a resolution of the quantizer.

38. The apparatus according to claim 29, wherein a further quantizer is provided between the digital second filter and the digital/analog converter.

* * * * *